United States Patent [19]
Zhu et al.

[11] Patent Number: 5,142,349
[45] Date of Patent: Aug. 25, 1992

[54] SELF-DOPED HIGH PERFORMANCE COMPLEMENTARY HETEROJUNCTION FIELD EFFECT TRANSISTOR

[75] Inventors: X. Theodore Zhu, Chandler; Jonathan K. Abrokwah; Herbert Goronkin, both of Tempe; William J. Ooms, Chandler; Carl L. Shurboff, Gilbert, all of Ariz.

[73] Assignee: Motorola, Inc., Schaumburg, Ill.

[21] Appl. No.: 724,077

[22] Filed: Jul. 1, 1991

[51] Int. Cl.$^5$ .............................................. H01L 27/02
[52] U.S. Cl. ....................................... 357/42; 357/15; 357/16; 357/22; 357/46
[58] Field of Search ....................... 357/15, 22, 16, 42, 357/46

[56] References Cited

U.S. PATENT DOCUMENTS 4,882,608  11/1989  Smith ................................. 357/22

OTHER PUBLICATIONS

Zhu et al.—Solid State Communications, vol. 75, No. 7, 1990, pp. 595–599.

Primary Examiner—Edward J. Wojciechowicz
Attorney, Agent, or Firm—Stuart T. Langley

[57] ABSTRACT

A heterojunction field effect transistor structure having a plurality of vertically stacked field effect devices. Two or more devices having electrically independent source and drain regions are formed such that a single gate electrode controls current flow in each of the devices. Each of the vertically stacked FETs have electrically isolated channel regions which may be controlled by a single gate electrode. Vertically stacked devices provide greater device packing density.

20 Claims, 2 Drawing Sheets

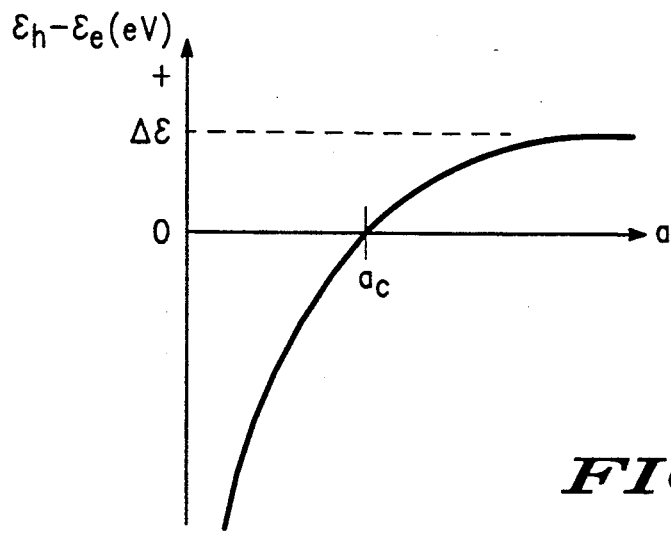
FIG. 3
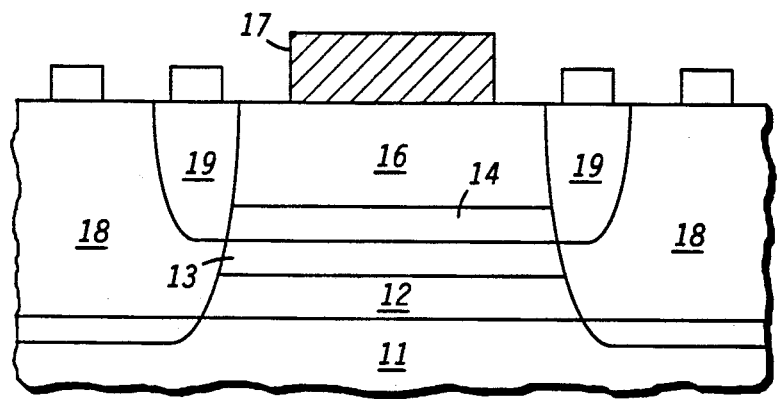
FIG. 4
FIG. 5
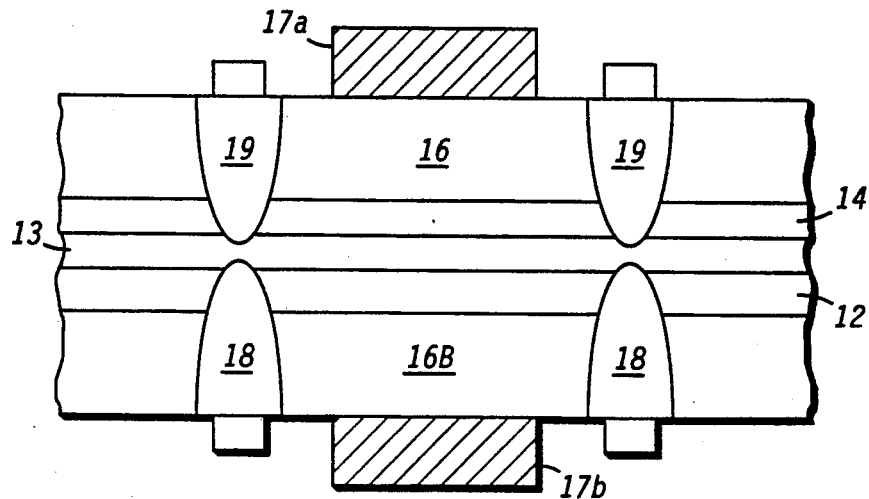

SELF-DOPED HIGH PERFORMANCE COMPLEMENTARY HETEROJUNCTION FIELD EFFECT TRANSISTOR

BACKGROUND OF THE INVENTION

This invention relates, in general, to field effect transistors, and more particularly, to field effect transistors having multiple vertically aligned channels.

Compound semiconductor based heterostructure devices have been predicted to offer significant speed and power advantages over silicon devices. Most compound semiconductor based HFET designs attempt to roughly duplicate silicon based structures using compound semiconductor materials. One disadvantage of this approach is that advantageous properties of the compound semiconductor materials are not fully used and minimum device geometries are unimproved over silicon counterparts. Because gallium arsenide chips are not substantially smaller than silicon based devices, they are not cost competitive with conventional CMOS technology. What is needed is a truly compact, high performance complementary heterojunction field effect transistor structure using compound semiconductor materials.

Power efficient semiconductor devices, such as silicon CMOS devices, use both N-channel and P-channel devices. A problem with conventional HFET structures is a mismatch in P-channel and N-channel threshold voltage and operating characteristics. Mismatch between N-channel and P-channel devices complicated processing and made circuits using the devices more complex. A complementary HFET with closely matched operating characteristics and high packing density is needed.

SUMMARY OF THE INVENTION

The advantages of the present invention are achieved by a heterojunction field effect structure having a plurality of vertically stacked field effect devices. Two or more devices having electrically independent source and drain regions are formed such that a single gate electrode controls current flow in each of the devices. Although each of the vertically stacked FETs have electrically isolated channel regions, the channel regions may be controlled by a single gate electrode. Vertically stacked devices provide greater device packing density.

BRIEF DESCRIPTION OF THE DRAWINGS

FIG. 3 illustrates, in graphical form, a relationship between quantized energy of a first hole state in a P-channel quantum well and a quantized energy of an electron state in an N-channel well as a function of quantum well thickness;

FIG. 4 illustrates a first embodiment of a complementary field effect transistor in accordance with the present invention; and FIG. 5 illustrates a second embodiment of a complementary field effect transistor in accordance with the present invention.

DETAILED DESCRIPTION OF THE DRAWINGS

Figure 1:
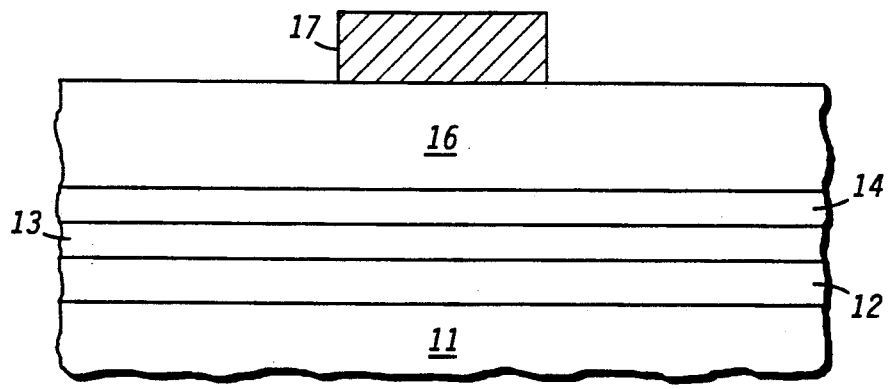
FIG. 1 illustrates a highly simplified cross section through a portion of a dual channel HFET in accordance with one embodiment of the present invention.

A primary concern in design of quantum well field effect transistors is the structure of the channel regions underneath the gate electrode as the channel region performance largely determines overall performance of the transistor. FIG. 1 illustrates a highly simplified cross section through channel regions above a complementary heterojunction field effect transistor in accordance with the present invention. All material layers shown in FIG. 1, and subsequent embodiments of the present invention are substantially single crystal epitaxially grown layers. This requires that each epitaxial layer comprise a material which is crystallographically compatible with an underlying substrate. Therefore, in addition to electronic material constraints discussed hereinafter in regard to the particular embodiments, it should noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

Although the present invention is described in terms of a complementary structure having a single N-channel and a single P-channel device, it should be understood that a variety of complementary and noncomplementary structures can be provided with slight modifications. These modifications are easily understood by those of skill in the art, and are intended to be encompassed within the scope of the present invention. For example, a structure can be made with a plurality of vertically stacked N-channel devices, each device having independent source/drain electrodes. Also, a plurality of vertically stacked P-channel devices may be provided simply by providing multiple P-channels. Further, both enhancement and depletion devices may be manufactured in the vertically stacked structure. Also, the layers may be provided in any order to achieve desired device function.

As described below, the preferred embodiment is described in terms of a self doping structure. Conventional doping techniques, including modulation doping, may also be used at some sacrifice in device performance in some applications.

The embodiment shown in FIG. 1 comprises a wide band gap buffer layer 11 comprising a material such as aluminum antimonide (AlSb). Other wide band gap materials are known and used in compound semiconductor devices, but, as will be seen, AlSb is desirable in the preferred embodiments to ensure compatibility with other materials used in overlying layers of the preferred embodiments. A P-channel quantum well 12 is formed covering AlSb buffer layer 11. In a preferred embodiment, P-channel quantum well 12 comprises gallium antimonide (GaSb). P-channel quantum well is covered by a barrier layer 13 having a predetermined thickness and comprising a material with a wide band gap such as AlSb.

N-channel quantum well 14 comprises a material such as indium arsenide (InAs) in the preferred embodiments and is formed over barrier 13. A second barrier layer 16 is formed over N-channel quantum well 14. Second barrier 16 also comprises a wide band gap material such as AlSb. Gate electrode 17 is formed over a portion of second barrier 16 and makes a Schottky contact with second barrier layer 16. It should be noted that P-channel quantum well 12 and N-channel quantum well 14 are substantially undoped and that no charge supply layer need be placed in the barrier layers.

Figure 2A:
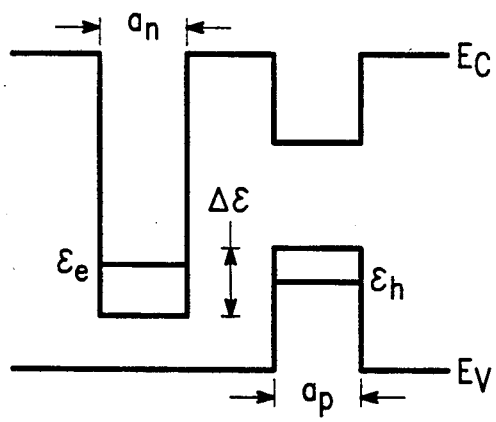
FIG. 2A illustrates a band diagram of the structure shown in FIG. 1 with no applied bias.
Figure 2B:
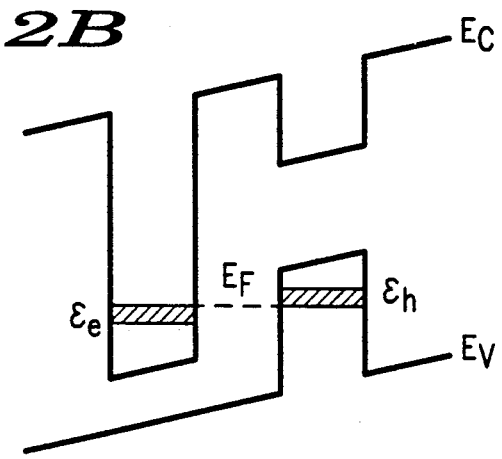
FIG. 2B illustrates a band diagram of the structure shown in FIG. 1 with an applied gate bias.

The particular materials for P-channel quantum well 12 and N-channel quantum well 14 are chosen because P-channel quantum well 12 must have a valence band energy greater than conduction band energy of N-channel quantum well 14 as illustrated in FIG. 2A and FIG. 2B to provide self doping. Much greater latitude in material choice is available if conventional doping techniques are used. Conduction band energy ($E_c$) and valence band energy ($E_v$) are illustrated in FIG. 2A and FIG. 2B through the cross section structure shown in FIG. 1.

P-channel quantum well 12 and N-channel quantum well 14 are formed in a wide band gap host material comprising barriers 11, 13, and 16. A quantized energy level for a first hole state ($\epsilon_h$) is indicated by a line within P-channel quantum well 12. $\epsilon_h$ lies at an energy somewhat lower than valence band energy for P-channel quantum well 12. The precise energy for $\epsilon_h$ is determined by thickness of P-channel quantum well 12, indicated by $a_p$. $\epsilon_h$ is the minimum energy for holes in P-channel quantum well 12.

Likewise, $\epsilon_e$ indicates a quantized energy level for a first electron state in N-channel quantum well 14. $\epsilon_e$ lies somewhat above conduction band energy for N-channel quantum well 14 and is also determined by thickness $a_n$ of N-channel quantum well 14. $\Delta\epsilon$ is an energy difference between valence band energy in P-channel quantum well 12 and conduction band energy in N-channel quantum well 14. When GaSb and InAs are used for the quantum wells, $\Delta\epsilon$ is about 0.175 eV. $\epsilon_e$ is the minimum energy for electrons in N-channel quantum well 14.

The predetermined thickness of barrier 13 is designed to allow overlap between the electron wave function in N-channel quantum well 14 and the hole wave function in P-channel quantum well 12. In other words, barrier 13 is thin enough that charge carriers can couple between the two quantum wells. When $\epsilon_h$ is at a greater energy than $\epsilon_e$, electrons in the valence band of P-channel quantum well 12 will prefer to move to N-channel quantum well 14. This creates a number of free electrons in N-channel quantum well 14 and an equal number of free holes in P-channel quantum well 12. Thus, when $\epsilon_h$ is greater than $\epsilon_e$ each quantum well dopes the other quantum well with charge carriers so that the quantum well becomes conductive. As illustrated in FIG. 2A, absent any bias applied by gate 17 (shown in FIG. 1) both P-channel quantum well 12 and N-channel quantum well 14 are undoped and non-conductive. As shown in FIG. 2B, however, with applied bias both P-channel quantum well 12 and N-channel quantum well 14 become doped and conductive.

It is important to note that although N-channel quantum well 14 and P-channel quantum well 12 are mutually self doping, the two channels remain electrically isolated. Charge conducted in N-channel 14 does not cross over to P-channel 12. Barrier 13 maintains electrical isolation so that the P-channel device operates independently of the N-channel device.

As noted hereinbefore, $\epsilon_e$ and $\epsilon_h$ vary with thickness of the quantum wells. As quantum well 12 becomes thinner, $\epsilon_h$ becomes more separated from $E_v$. Likewise, as quantum well 14 becomes thinner, $\epsilon_e$ becomes more separated from $E_c$. This aspect of the self doping structure shown in FIG. 1 can be used to create HFET structures having both depletion mode and enhancement mode characteristics.

FIG. 3 graphically illustrates the relative energy difference between $\epsilon_e$ and $\epsilon_h$ as quantum well thickness is changed. The graph in FIG. 3 illustrates quantum well thickness on the horizontal axis, assuming that both quantum wells are the same thickness (a) for ease of illustration. The vertical axis in FIG. 3 represents energy difference between the first hole state in P-channel quantum well 12 and the first electron state in N-channel quantum well 14. It can be seen in FIG. 3 that at some critical thickness $a_c$, $\epsilon_h$ and $\epsilon_e$ are at the same energy. This critical thickness is about 100 angstroms for the materials described in the preferred embodiments. As quantum well thickness increases $\epsilon_h$ becomes increasingly greater than $\epsilon_e$ and self-doping will occur as described hereinbefore. When quantum wells 12 and 14 are sufficiently thin, $\epsilon_h$ is less than $\epsilon_e$ in an unbiased condition. Thus, when quantum wells 12 and 14 are thin, P-channel quantum well 12 and N-channel quantum well 14 are undoped and non-conductive absent an external bias.

Several features of the self-doping structure shown in FIG. 1 should be noted. First, the self-doping is simultaneous; both the N-channel and P-channel are activated with mobile charge to the same degree at the same time. Second, the nature of the materials used and the self-doping process results in a tremendous quantity of charge carriers being transferred between the wells so that once self-doping has occurred, charge carrier concentration is quite high in each of the quantum wells and conductivity is correspondingly high. Also, quantum wells 12 and 14 are free of impurities and thus achieve very close to their intrinsic mobility. Also, unlike conventionally doped quantum wells, when $\epsilon_h$ is less than $\epsilon_e$, charge carriers simply can not exist in either of the quantum wells because a forbidden energy gap exists between $\epsilon_h$ and $\epsilon_e$. This forbidden energy gap is expected to produce remarkably low leakage when the channels are in a non-conductive state.

FIG. 4 illustrates a first embodiment complementary heterojunction field effect transistor structure in accordance with the present invention. The structure shown in FIG. 4 is somewhat more complex than the structure shown in FIG. 1 as FIG. 4 illustrates actual structures needed to produce field effect transistors. Layers and regions bearing the same designation as FIG. 1 comprise similar materials and perform similar functions as described in FIG. 1.

Starting with the epitaxial layer structure shown in FIG. 1, P-type source/drain regions 18 are formed on opposed sides of a single gate 17. P-type source/drain regions 18 extend from a surface of barrier 16 to P-channel quantum well 12. When a positive voltage is applied to gate 17, band bending occurs as shown in FIG. 2B and a two dimensional hole gas (2-DHG) forms in P-channel quantum well 12. The 2-DHG couples P-type drain/source regions 18 and the P-channel FET is conductive. It should be noted that P-channel quantum well 12 becomes conductive when a positive voltage is applied rather than a negative voltage which is typically associated with P-channel conductivity.

The design shown in FIG. 4 takes advantage of the high mobility of GaSb in P-channel quantum well 12 without compromising that high mobility using conventional doping impurities. Similarly, N-type source/drain regions 19 are formed on opposed sides of gate 17 extending from the surface of barrier 16 to N-channel quantum well 14. Source/drain regions 18 and 19 are junction isolated from each other. When a positive gate voltage is applied to gate 17, electrons are provided to N-channel quantum well 14 from the valence band of P-channel quantum well 12 and a two dimensional electron gas (2-DEG) forms in N-channel quantum well 14. Again, full advantage of the naturally high mobility of InAs in N-channel quantum well 14 is achieved without compromise due to dopant impurities. It should also be noted that a high level of isolation is provided between the P-channel and N-channel HFETs.

The complementary HFET structure shown in FIG. 4 is a relatively straightforward realization using the self-doped quantum wells of the present invention although is not optimized to take maximum advantage of the self-doping feature. The structure shown in FIG. 4, however, is expected to have superior performance to conventional CHFET structures. FIG. 4 illustrates a key feature of the present invention of vertically stacked field effect transistors having electrically independent source/drain regions.

In this embodiment, a positive voltage applied on gate 17 causes band bending as illustrated in FIG. 2B resulting in mutual self doping of N-channel quantum well 14 and P-channel quantum well 12 simultaneously. Thus a single gate voltage makes both the N-channel and the P-channel devices conductive. This CHFET structure offers greatly reduced size from prior devices and efficient use of the self-doping feature of the present invention.

Many obvious variations of the structure shown in FIG. 4 are possible. More than two vertically stacked transistors may be formed, and N-channel and P-channel quantum wells can be stacked in any order, so long as each channel is doped either by conventional doping techniques or the self doping method described in reference to FIGS. 1–3. Also, thicker quantum wells provide depletion mode performance for either N-channel or P-channel devices.

FIG. 5 illustrates still another embodiment of the present invention achieving minimum device geometry for a CHFET structure. Buffer layer 11 is replaced by a wide band gap barrier 16b. P-type source/drain regions 18 are diffused from a base surface of barrier 16b to P-channel quantum well 12. Likewise N-type source/drain regions 19 are diffused from a surface of barrier region 16 to N-channel quantum well 14. Back gate 17b may be used to control conductivity in P-channel quantum well 12, but is not necessary as single gate 17a can control conductivity in both N-channel quantum well 14 and P-channel quantum well 12 as described hereinbefore.

The embodiment shown in FIG. 5 illustrates that in the space previously required for a single HFET device, a pair of coupled, complementary HFET devices may be formed using the structure in accordance with the present invention. Drain/source electrodes are optionally formed in contact with the drain/source regions and may be used to interconnect the devices. Alternatively, devices may be internally coupled without using electrodes as is often done in conventional integrated circuits.

By now it should be appreciated that a self-doped complementary heterojunction field effect transistor with improved performance is provided. The HFET structure in accordance with the present invention allows optimal use of superior materials for HFET technology as well as efficient geometries for high packing density. Further, the HFET in accordance with the present invention provides a P-channel and N-channel device coupled in a manner that, until now, was impossible allowing for new functions to be performed using fewer devices and simpler try than has been possible.

We claim:

1. A self-doped field effect transistor (FET) comprising: a crystal buffer layer; a first quantum well comprising a first material epitaxially formed on the buffer layer; a first barrier covering the first quantum well; a second quantum well comprising a second material formed on the first barrier, wherein the first barrier has a larger bandgap than either the first or second materials, and is sufficiently thin to allow charge coupling between the first and second quantum wells; a second barrier formed covering the second quantum well and having an upper surface; a gate electrode formed on the upper surface of the second barrier, wherein a bias voltage applied to the gate electrode controls charge carrier transfer between the first quantum well and the second quantum well; and a pair of source/drain regions formed on opposed sides of the gate electrode, wherein each of the source/drain regions extends from the upper surface of the second barrier layer and electrically couples to either the first quantum well, the second quantum well, or both.

2. The FET of claim 1 wherein at zero bias on the gate electrode a first electron state in the second material is at a lower energy than a first hole state in the first material, thus providing electron transfer from the first material to the second material and hole transfer from the second material to the first material; and when a predetermined negative voltage is applied to the gate electrode, the energy of the first electron state in the second material is raised above the energy of the first hole state in the first material, thus providing no charge transfer between the first and second materials.

3. The FET of claim 1 wherein at zero bias on the gate electrode, a first electron state in the second material is at a higher energy that a first hole state in the first material, thus providing no charge transfer between the first and second materials; and when a predetermined positive voltage is applied to the gate electrode, the energy of the first electron state in the second material is pushed below the energy of the first hole state in the first material, thus providing electron transfer from the first material to the second material and hole transfer from the second material to the first material.

4. The FET of claim 1 wherein the first material comprises undoped gallium antimonide and the second material comprises indium arsenide.

5. The FET of claim 2 wherein the first material comprises undoped gallium antimonide, the second material comprises indium arsenide and the first and second quantum wells are thicker than approximately 100 angstroms.

6. The FET of claim 3 wherein the first material comprises undoped gallium antimonide, the second material comprises indium arsenide and the first and second quantum wells are thinner than approximately 100 angstroms.

7. The FET of claim 1 further comprising a second pair of source/drain regions of a second conductivity type coupled to at least one of the quantum wells.

8. The FET of claim 1 wherein the first barrier comprises aluminum antimonide approximately 100 angstroms thick.

9. A self-doped complementary HFET structure comprising: a buffer layer comprising a wide bandgap crystal; a GaSb layer epitaxially formed on the buffer layer; a first barrier formed on the GaSb layer; an InAs layer epitaxially formed on the first barrier; a second barrier epitaxially formed on the InAs layer, wherein the second barrier has an upper surface and the first and second barriers comprise a wide bandgap material; a gate electrode making a Schottky contact to a portion of the upper surface of the second barrier layer; a first source electrode formed on the upper surface of the second barrier; a second source electrode formed on the upper surface of the second barrier; a first drain electrode formed on the upper surface of the second barrier, wherein the gate electrode lies between the first source electrode and the first drain electrode; a second drain electrode formed on the upper surface of the second barrier wherein the gate electrode lies between the second source electrode and the second drain electrode; a p-type source diffusion coupling the first source electrode to the GaSb layer; a p-type drain diffusion coupling the first drain electrode to the GaSb layer; an n-type source diffusion coupling the second source electrode to the InAs layer; and an n-type drain diffusion coupling the second drain electrode to the InAs layer.

10. The HFET structure of claim 9 wherein the buffer layer and the first and second barriers comprise AlSb.

11. The HFET structure of claim 9 wherein the InAs layer and the BaSb layer are less than approximtely 100 angstroms thick.

12. The HFET structure of claim 9 wherein the InAs layer has a first electron state energy, the GaSb layer has a first hole state energy, and the GaSb and InAs layers have predetermined thicknesses so that the irst electron state is at a lower energy than the first hole state.

13. The HFET structure of claim 9 wherein electrons in the GaSb layer transfer to the InAs layer when a positive voltage is applied to the gate eletrode.

14. The HFET structure of claim 9 wherein the GaSb layer and the InAs layer are substantialy fre of impurity doping atoms.

15. A complementary HFET structure comprising: an AlsB host material having a first and a second surface; and InAs quantum well formed in the host material; a GaSb quantum well formed in the host material, separated from the InAs quantum well by a thin barrier of AlSb host material, wherein the InAs quantum well is nearest the first surface, and the GaSb quantum well is nearest the second surface; a first gate electrode formed on the top surface; a pair of n-type source/drain regions formed on opposed sides of the first gate electrode, wherein each of the n-type source/drain regions extends downward from the first surface to the InAs quantum well; a second gate electrode formed on the second surface aligned to the first gate electrode; and a pair of p-type source/drain regions formed on opposed sides of the second gate electrode, wherein each of the p-type source/drain regions extends upward from the second surface to the GaSb quantum well.

16. A field effect transistor structure comprising: a gate electrode; a first channel formed under the gate electrode; a second channel formed under the gate electrode and under the first channel, wherein the second channel is electrically isolated from the first channel; a first pair of drain/source regions formed on opposed sides of the gate electrode and electrically coupled to the first channel and not electrically coupled to the second channel, wherein voltage on the gate electrode controls charge flow through the first channel between the first pair of drain/source regions; a second pair of drain/source regions formed on opposed sides of the gate electrode and electrically coupled to the second channel and not electrically coupled to the first channel, wherein voltage on the gate electrode controls charge flow through the second channel between the second pair of drain/source regions.

17. the field effect transistor structure of claim 16 wherein the first channel conducts charge via excess holes and the second channel conducts charge via excess electrons.

18. The field effect transistor structure of claim 16 wherein the first and second channel conduct charge via excess holes.

19. The field effect transistor structure of claim 16 wherein the first and second channel conduct charge via excess electrons.

20. The field effect transistor structure of claim 16 wherein at least one of the first or the second channel is conductive without bias on the gate electrode, and nonconductive when bias is applied to the gate electrode.

* * * * *

UNITED STATES PATENT AND TRADEMARK OFFICE
CERTIFICATE OF CORRECTION

PATENT NO. : 5,142,349
DATED : August 25, 1992
INVENTOR(S) : Zhu et al.

It is certified that error appears in the above-indentified patent and that said Letters Patent is hereby corrected as shown below:

Claim 11, column 7, line 31 "BaSb" should read --GaSb--.
Claim 12, column 7, line 36 "irst" should read --first--.
Claim 13, column 7, line 41 eletrode" should read --electrode--.
Claim 14, column 7, line 43 "substantialy" should read --substantially--.
Claim 14, coulmn 7, line 43 "fre" should read --free--.
Claim 15, column 7, line 46 "AlsB" should read --AlSb--.
Claim 15, column 7, line 47 "and" should read --an--.

Signed and Sealed this

Eighth Day of November, 1994

Attest:

BRUCE LEHMAN

Attesting Officer

Commissioner of Patents and Trademarks